(12) United States Patent
Hong et al.

(10) Patent No.: US 10,886,200 B2
(45) Date of Patent: Jan. 5, 2021

(54) POWER MODULE AND MANUFACTURING METHOD THEREOF

(71) Applicant: Delta Electronics,Inc., Taoyuan (CN)

(72) Inventors: Shouyu Hong, Taoyuan (CN); Haibin Xu, Taoyuan (CN); Wei Cheng, Taoyuan (CN); Tao Wang, Taoyuan (CN); Zhenqing Zhao, Taoyuan (CN)

(73) Assignee: Delta Electronics, Inc., Taoyuan (CN)

( * ) Notice: Subject to any disclaimer, the term of this patent is extended or adjusted under 35 U.S.C. 154(b) by 0 days.

(21) Appl. No.: 16/258,747

(22) Filed: Jan. 28, 2019

(65) Prior Publication Data

US 2019/0304882 A1 Oct. 3, 2019

(30) Foreign Application Priority Data

Mar. 29, 2018 (CN) .......................... 2018 1 0270703

(51) Int. Cl.
*H01L 23/48* (2006.01)
*H01L 23/495* (2006.01)
(Continued)

(52) U.S. Cl.
CPC .... *H01L 23/49524* (2013.01); *H01L 21/4842* (2013.01); *H01L 23/48* (2013.01);
(Continued)

(58) Field of Classification Search
CPC ......... H01L 23/49524; H01L 23/49575; H01L 25/072; H01L 25/18; H01L 25/50
See application file for complete search history.

(56) References Cited

U.S. PATENT DOCUMENTS 9,147,622 B2 * 9/2015 Otake ................... H01L 21/566
9,691,673 B2 * 6/2017 Otake ..................... H01L 23/13
(Continued)

FOREIGN PATENT DOCUMENTS

CN 107170714 A 9/2017
CN 107369657 A 11/2017
(Continued)

OTHER PUBLICATIONS

The JP1OA dated Mar. 3, 2020 by the JPO.
The EESR dated Jul. 4, 2019 by the EPO.
The CN1OA dated Jul. 3, 2020 by the CNIPA.

*Primary Examiner* — Nicholas J Tobergte
(74) *Attorney, Agent, or Firm* — Yunling Ren

(57) ABSTRACT

The present disclosure relates to a power module and a manufacturing method thereof. The power module includes: a group of switch elements, a molding part and a connector. The group of switch elements includes at least one pair of switch elements. The molding part molds the group of switch elements. The connector includes a signal terminal and a power terminal respectively electrically connected to the signal end and power end of the group of switch elements, and both fanned out from the molding part. The power terminal includes a positive power terminal, a negative power terminal and an output power terminal. The positive power terminal and the negative power terminal are respectively a first metal layer and a second metal layer which are at least partially stacked, and an insulating layer is disposed between the first metal layer and the second metal layer.

19 Claims, 19 Drawing Sheets

(51) Int. Cl.
*H01L 21/48* (2006.01)
*H01L 25/07* (2006.01)
*H01L 25/00* (2006.01)
*H01L 25/18* (2006.01)

(52) U.S. Cl.
CPC ...... *H01L 23/49575* (2013.01); *H01L 25/072* (2013.01); *H01L 25/18* (2013.01); *H01L 25/50* (2013.01)

(56) References Cited

U.S. PATENT DOCUMENTS

| | | | | |
|---|---|---|---|---|
| 9,960,103 | B2* | 5/2018 | Hanada | H01L 25/115 |
| 2014/0159054 | A1* | 6/2014 | Otake | H01L 25/072 |
| | | | | 257/77 |
| 2017/0162466 | A1* | 6/2017 | Sawada | H01L 25/115 |

FOREIGN PATENT DOCUMENTS

| | | | |
|---|---|---|---|
| CN | 107393901 | A | 11/2017 |
| EP | 1172908 | A2 | 1/2002 |
| EP | 2899757 | A1 | 7/2015 |
| JP | 2011216755 | A | 10/2011 |
| JP | 2015185833 | A | 10/2015 |
| JP | 2016092166 | A | 5/2016 |
| JP | 2016144377 | A | 8/2016 |
| WO | 2014208450 | A1 | 12/2014 |
| WO | 2017119226 | A1 | 7/2017 |
| WO | 2017209191 | A1 | 12/2017 |

* cited by examiner

POWER MODULE AND MANUFACTURING METHOD THEREOF

CROSS REFERENCE

This application is based upon and claims priority to Chinese Patent Application No. 201810270703.4, filed on Mar. 29, 2018, the entire contents thereof are incorporated herein by reference.

TECHNICAL FIELD

The present disclosure relates to the field of power electronics, and in particular to a power module and a manufacturing method thereof.

BACKGROUND

In the field of power electronics technology, power modules have been widely used. Especially with the continuous increase of the power and the gradual decrease of the volume of the power supply, the modularization of the switching devices has become a development trend.

In a conventional power module, multiple switch elements may be packaged into one integral, but signal terminals and power terminals are often fanned out with a single-layer lead-frame, which may cause a large parasitic inductance in the power module. FIG. 1 shows a schematic diagram of a half bridge circuit topology. As shown in FIG. 1, the circuit includes two switch elements S1 and S2 connected in series, and a capacitor C connected in parallel with the series connection branch, in which P, O, N indicate three input/output power terminals. Then the circuit includes parasitic inductances L1 from P to S1, parasitic inductances L3, L4 between S1 and S2, and parasitic inductance L2 from S2 to N. The switch elements S1 and S2 are packaged in the same package structure to form a power module. When the power terminals are fanned out in a single layer, the parasitic inductance L1+L2+L3+L4 in the module can be generally large, and the existence of these parasitic inductances may greatly affect the switching characteristics of the switching devices S1 and S2, causing a large spike voltage on these switching devices, which may in turn affect the efficiency of the power module and fail to meet the application requirements.

Molding type power module package structure mainly includes a chip, a substrate, a bonding wire, a signal terminal, a power terminal, connecting material and molding compound. The raw material of the signal terminal and the power terminal is etched from the same piece of metal or a stamped lead-frame. FIG. 2 is a flowchart of a manufacturing method of a power module. As shown in FIG. 2, the manufacturing method of the power module includes: a: assembling a chip and a lead-frame to a substrate; b: connecting the chip and the corresponding terminal of the lead-frame; c: molding; and d: trimming. As to the profiling mold-die for the molding, it is required that the tolerance of the distance between the molding positioning hole 4000 and the terminal 4001 should be about ±30 um, and the tolerance of the body size of the terminal 4001 is about ±10 um. However, when any change occurs in the package structure, the existing packaging process cannot meet the packaging requirements anymore.

Therefore, there is a demand for improvements in the power module and the manufacturing method thereof.

SUMMARY

According to a first aspect of the present disclosure, there is provided a manufacturing method of a power module, including: providing a group of switch elements, the group of switch elements including at least one pair of switch elements; providing a connector, wherein the connector includes a signal terminal, a power terminal, and a connecting portion, the power terminal includes a positive power terminal, a negative power terminal and an output power terminal, the connecting portion connects the signal terminal, the positive power terminal, the negative power terminal and the output power terminal together, the positive power terminal and the negative power terminal are respectively a first metal layer and a second metal layer, the first metal layer and the second metal layer are at least partially stacked, and an insulating layer is disposed between the first metal layer and the second metal layer; electrically connecting the connector to the group of switch elements, wherein the signal terminal is electrically connected to a signal end of the group of switch elements, and the power terminal is electrically connected to a power end of the group of switch elements; providing a molding part, packaging the group of switch elements and fanning out the signal terminal and the power terminal from the molding part; and trimming the connector.

According to a second aspect of the present disclosure, there is provided a power module, including: a group of switch elements, the group of switch elements including at least one pair of switch elements; a molding part packaging the group of switch elements; and a connector, including: a signal terminal electrically connected to the signal end of the group of switch elements and fanned out from the molding part, and a power terminal electrically connected to a power end of the group of switch elements and fanned out from the molding part, wherein the power terminal includes a positive power terminal, a negative power terminal and an output power terminal, the positive power terminal and the negative power terminal are respectively a first metal layer and a second metal layer, the first metal layer and the second metal layer are at least partially stacked, and an insulating layer is disposed between the first metal layer and the second metal layer.

BRIEF DESCRIPTION OF THE DRAWINGS

The above and other objects, features, and advantages of the present disclosure will become more apparent from the aspects of the embodiments.

The accompanying drawings, which are incorporated in and constitute a part of this specification, illustrate embodiments consistent with the disclosure and, together with the description, serve to explain the principles of the disclosure. It is apparent that the drawings in the following description are only some of the embodiments of the present disclosure, and other drawings may be obtained from those skilled in the art without departing from the drawings.

DETAILED DESCRIPTION

Figure 1:
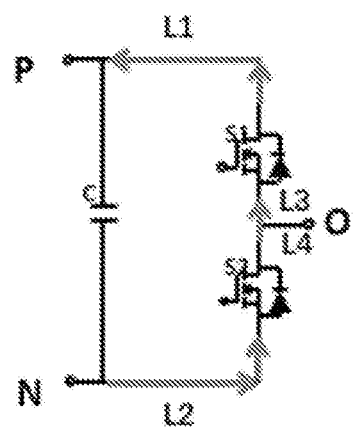
FIG. 1 is a schematic diagram of a half bridge circuit topology.

Example embodiments will now be described more full with reference to the accompanying drawings. The example embodiments can be embodied in a variety of forms, and should not be construed as being limited to the examples set forth herein; the described features, structures, or characteristics may be combined in any suitable manner in one or more embodiments. In the following description, numerous specific details are set forth However, one skilled in the art will appreciate that one or more of the specific details may be omitted or other methods, components, devices, steps, etc, may be employed.

It should be noted that in the drawings, the dimensions of layers and regions may be exaggerated for clarity of illustration. It may also be understood that when an element or layer is referred to as "on" another element or layer, it may be directly on the other element or an intermediate layer may be present. In addition, it can be understood that when an element or layer is referred to as being "under" another element or layer, it may be directly under the other element or may have more than one intermediate layer or element. In addition, it can also be understood that when a layer or element is referred to as being "between" two layers or two elements, it can be a single layer between the two layers or the two elements, or more than one intermediate layer or element be present. Like reference numerals indicate like elements throughout.

The present disclosure provides a power module and a manufacturing method thereof. The power module includes a group of switch elements including at least one pair of switch elements; a molding part for packaging the group of switch elements; and a connector, including a signal terminal, electrically connected to the signal end of the group of switch elements, and fanned out from the molding part, and a power terminal electrically connected to the power end of the group of switch elements and fanned out from the molding part. The power terminal includes a positive power terminal, a negative power terminal and an output power terminal. The positive power terminal and the negative power terminal are respectively a first metal layer and a second metal layer. The first metal layer and the second metal layer are at least partially stacked, and an insulating layer is disposed between the first metal layer and the second metal layer. By stacking the positive power terminal and the negative power terminal, the parasitic inductance of the power module can be greatly reduced. In addition, in the manufacture of the power module, by integrating the signal terminal, the power terminal and the connecting portion into an integral connector, the tolerance between the molding positioning hole and the power terminal can be ±30 um, and the tolerance of the body size of the terminal can be ±10 um, which can satisfy the package requirement and facilitate production.

Figure 3:
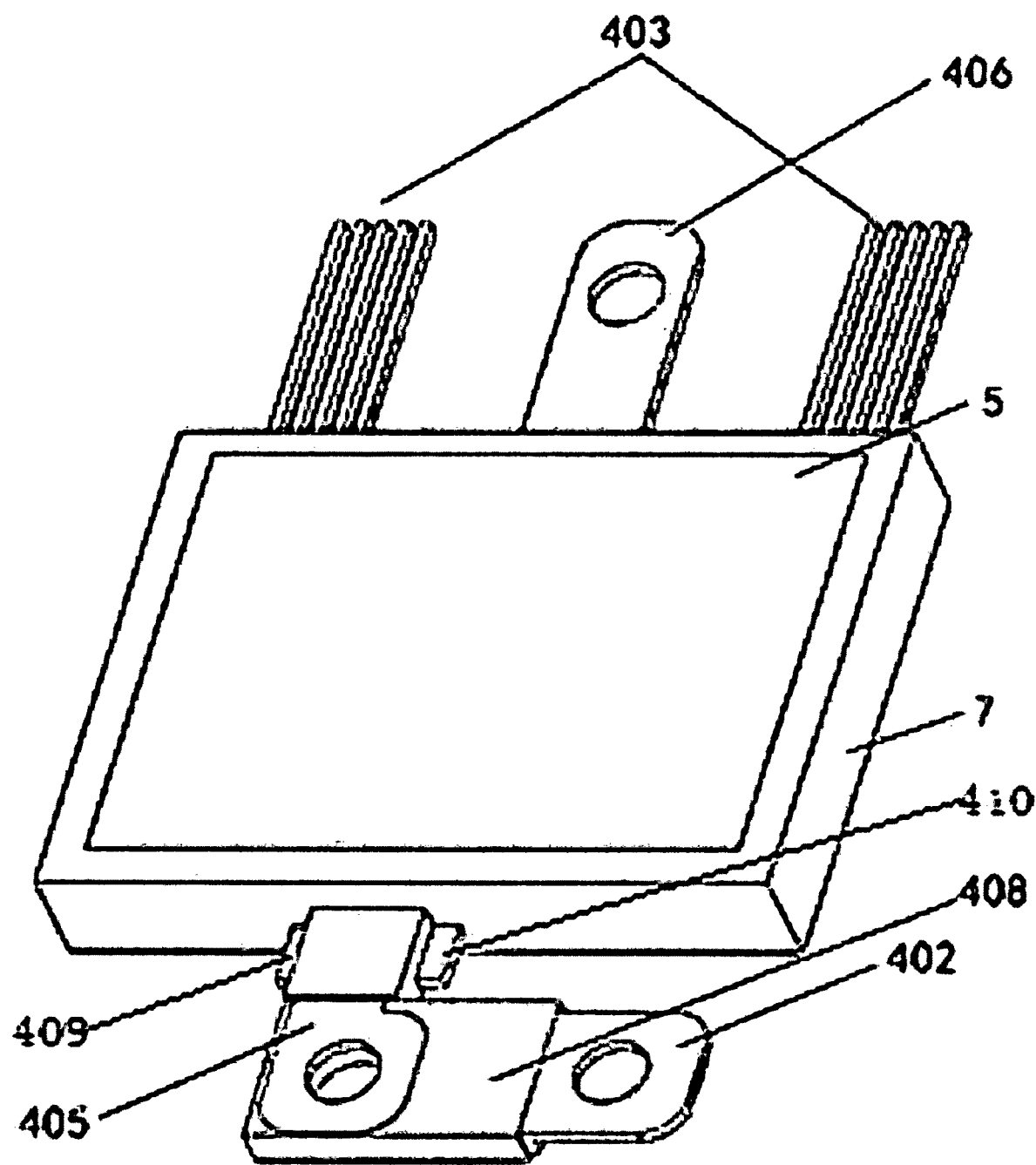
FIG. 3 is a schematic diagram of a power module according to an embodiment of the present disclosure.
Figure 4:
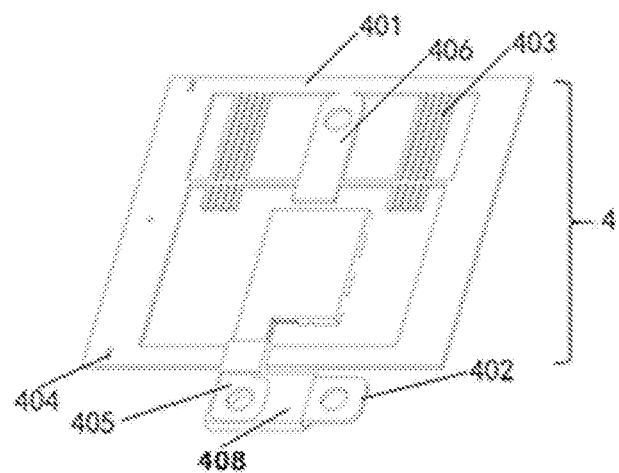
FIG. 4 is a schematic diagram of a connector according to an embodiment of the present disclosure.
Figure 5:
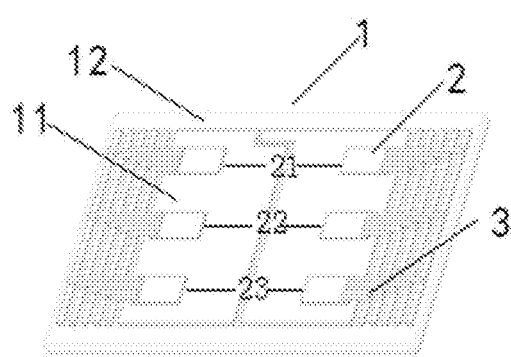
FIG. 5 is a schematic diagram of mounting a group of switch elements on a base substrate according to an embodiment of the present disclosure.

FIG. 3 shows a schematic diagram of a power module according to an embodiment of the present disclosure. FIG. 4 shows a schematic diagram of a connector according to an embodiment of the present disclosure. FIG. 5 is a schematic diagram of mounting a group of switch elements on a base substrate according to an embodiment of the present disclosure.

As shown in FIGS. 3-5, the power module includes a group 2 of switch elements, a molding part 7 and a connector 4. The group 2 of switch elements includes at least one pair of switch elements (three pairs 21, 22 and 23 of switch elements are shown). The present disclosure does not limit the number of pairs of switch elements. The molding part 7 is configured to package the group 2 of switch elements. The connector 4 includes a signal terminal 403 and a power terminal. The signal terminal 403 is electrically connected to the signal end of the group 2 of switch elements and fanned out from the molding part 7. The power terminal is electrically connected to the power end of the group 2 of switch elements, and fanned out from the molding part 7. The power terminal includes a positive power terminal 405, a negative power terminal 402 and an output power terminal 406. The positive power terminal 405 and the negative power terminal 402 are a first metal layer and a second metal layer, respectively. The first metal layer and the second metal layer are partially or completely stacked, and an insulating layer 408 is disposed between the first metal layer and the second metal layer to ensure electrical insulation between the positive power terminal 405 and the negative power terminal 402.

By providing the positive power terminal 405 and the negative power terminal 402 as partially or completely stacked metal layers, the loop inductance of the power module can be effectively cancelled, thereby reducing the parasitic inductance of the power module and meeting the requirement of low inductance.

It should be understood that there may be multiple signal terminals 403, which can be configured to transmit signals from inside of the module to outside of the module, for example, transmitting parameter information such as current, voltage and temperature, sampled in the power module to outside of the module. Or, the multiple signal terminals 403 can be configured to receive signals from outside of the module to apply in the module, for example, receiving a control signal from outside of the module to control switching on or off of the switch element inside of the module, and so on.

According to an embodiment of the present disclosure, on the outside of the molding part 7, the positive power terminals 405 and the negative power terminals 402 have protrusions 409 and 410 on the left and right sides respectively.

According to an embodiment of the present disclosure, as shown in FIG. 5, the power module further includes a base substrate 1. The group 2 of switch elements is mounted on the base substrate 1, and the group 2 of switch elements and the base substrate 1 are packaged together in the molding part 7. Further, the power module may further include a top substrate 5. The group 2 of switch elements is disposed between the top substrate 5 and the base substrate 1, and the group 2 of switch element, the top substrate 5 and the base substrate 1 are molded together in the molding part 7. The base substrate 1 and the top substrate 5 may be a DBC substrate, a Cu substrate, an Al substrate, an Al—SiC substrate, or the like. The top substrate 5 and the base substrate 1 may be the same type of substrate or different type. It should be understood that the present disclosure does not limit whether to provide the top substrate.

According to an embodiment of the present disclosure, as shown in FIG. 3, the positive power terminal 405 and the negative power terminal 402 are fanned out from a first side of the molding part 7, and the signal terminal 403 and the output power terminal 406 are fanned out from a second side of the molding part 7. The first side is opposite to the second side. It should be understood that the positions where the signal terminal 403, the positive power terminal 405, the negative power terminal 402, and the output power terminal 406 are fanned out can be adjusted as desired.

According to an embodiment of the present disclosure, a distance between the first metal layer and the second metal layer is not more than 0.5 mm, which facilitates effective cancellation of the loop inductance.

According to an embodiment of the present disclosure, the switch element in the group 2 of switch elements may be an IGBT, a MOSFET or a transistor. However, the disclosure is not limited thereto.

According to an embodiment of the present disclosure, the pair 21, 22 or 23 of switch elements includes a first switch element S1 and a second switch element S2, the circuit connection topology of which is shown in FIG. 1. The first switch element S1 includes a first end, a second end and a third end. The second switch element S2 includes a fourth end, a fifth end and a sixth end. The second end and the fourth end are electrically connected together as the power terminal O electrically connected to the output power terminal 406. The first end, as the power terminal P, is electrically connected to the positive power terminal 405. The fifth end, as the power terminal N, is electrically connected to the negative power terminal 402. The third end and the sixth end, as signal ends, are electrically connected to the signal terminal 403.

It should be understood that when the group 2 of switch elements includes a plurality of pairs of switch elements, the plurality of pairs of switch elements are connected in parallel with each other. That is, the positive power end of one pair of switch elements and the positive power end of the other pair of switch elements are electrically connected. The negative power terminal of one pair of switch elements is electrically connected to the negative power terminal of the other pair of switch elements. The output power end of one pair of switch elements is electrically connected to the output power end of the other pair of switch elements.

Figure 6:
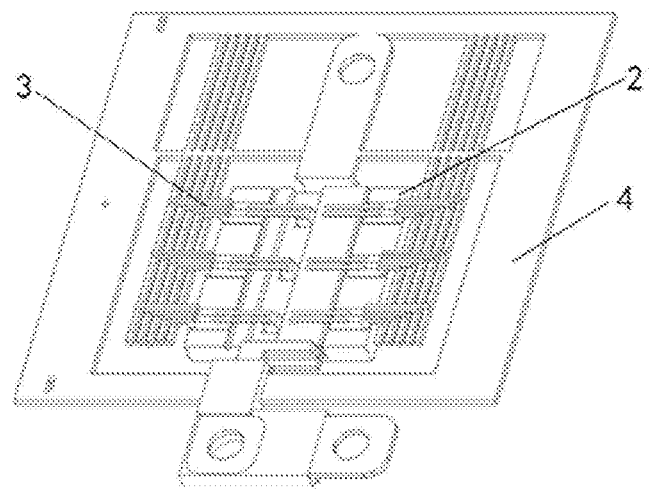
FIG. 6 is a schematic diagram of mounting a group of switch elements to a connector according to an embodiment of the present disclosure.

FIG. 6 is a schematic diagram of mounting a group of switch elements to a connector according to an embodiment of the present disclosure, which differs from FIG. 5 in that the group 2 of switch elements is directly mounted on the connector 4 instead of mounting the group 2 of switch elements on the base substrate 1. This solution can eliminate the cost of the base substrate and reduce the cost of the power module.

According to an embodiment of the present disclosure, the switch elements in the group 2 may be mounted to the positive power terminal 405 or the negative power terminal 402.

Figure 2:
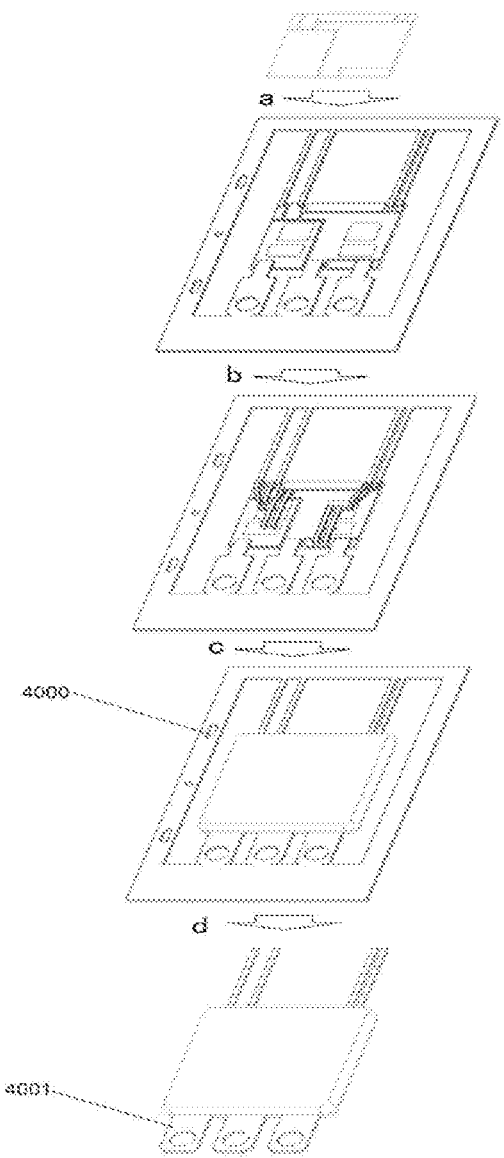
FIG. 2 is a flowchart of a manufacturing method of a power module.
Figure 7:
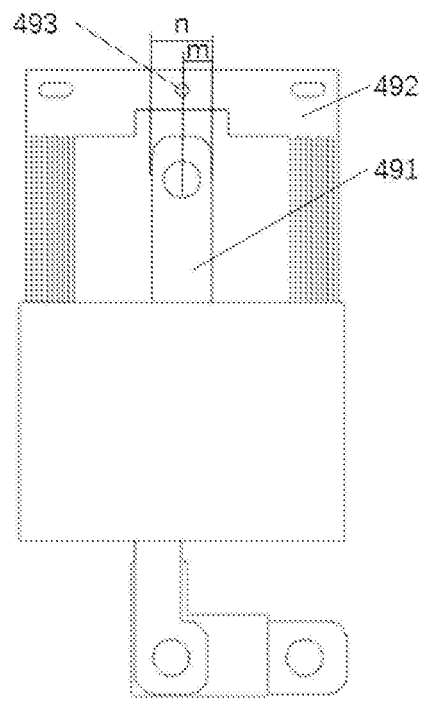
FIG. 7 is a schematic diagram showing positioning dimensions of a power module according to an embodiment of the present disclosure.

FIG. 7 is a schematic diagram showing positioning dimensions of a power module according to an embodiment of the present disclosure. As shown in FIG. 7, the connector in the power module includes a lead-frame 492 with a signal terminal and a bus-bar 491 as a power terminal. The lead-frame 492 is provided with a molding positioning hole 493. If the power module of the present disclosure is fabricated by the method shown in FIG. 2, the lead-frame 492 and the bus-bar 491 are respectively assembled with the substrate. The tolerance m of the distance between the assembled molding positioning hole 493 and the bus-bar 491 is ±200 um. The tolerance n of the body size of the bus-bar 491 is ±10 um. The profiling mold-die for molding requires that the tolerance m of the distance between the molding positioning hole 493 and the bus-bar 491 is generally ±30 um. The tolerance n of the body size of the bus-bar 491 is generally ±10 um. Apparently, the conventional manufacturing method cannot meet the molding process requirements of the power module of the present disclosure and cannot be used for production.

To this end, the present disclosure provides a manufacturing method of a power module, which integrates a signal terminal, a power terminal and a connecting portion into an integral connector to meet the positioning accuracy requirement and complete the package. The method for manufacturing the power module of the present disclosure will be described in detail below with reference to the accompanying drawings.

Figure 8:
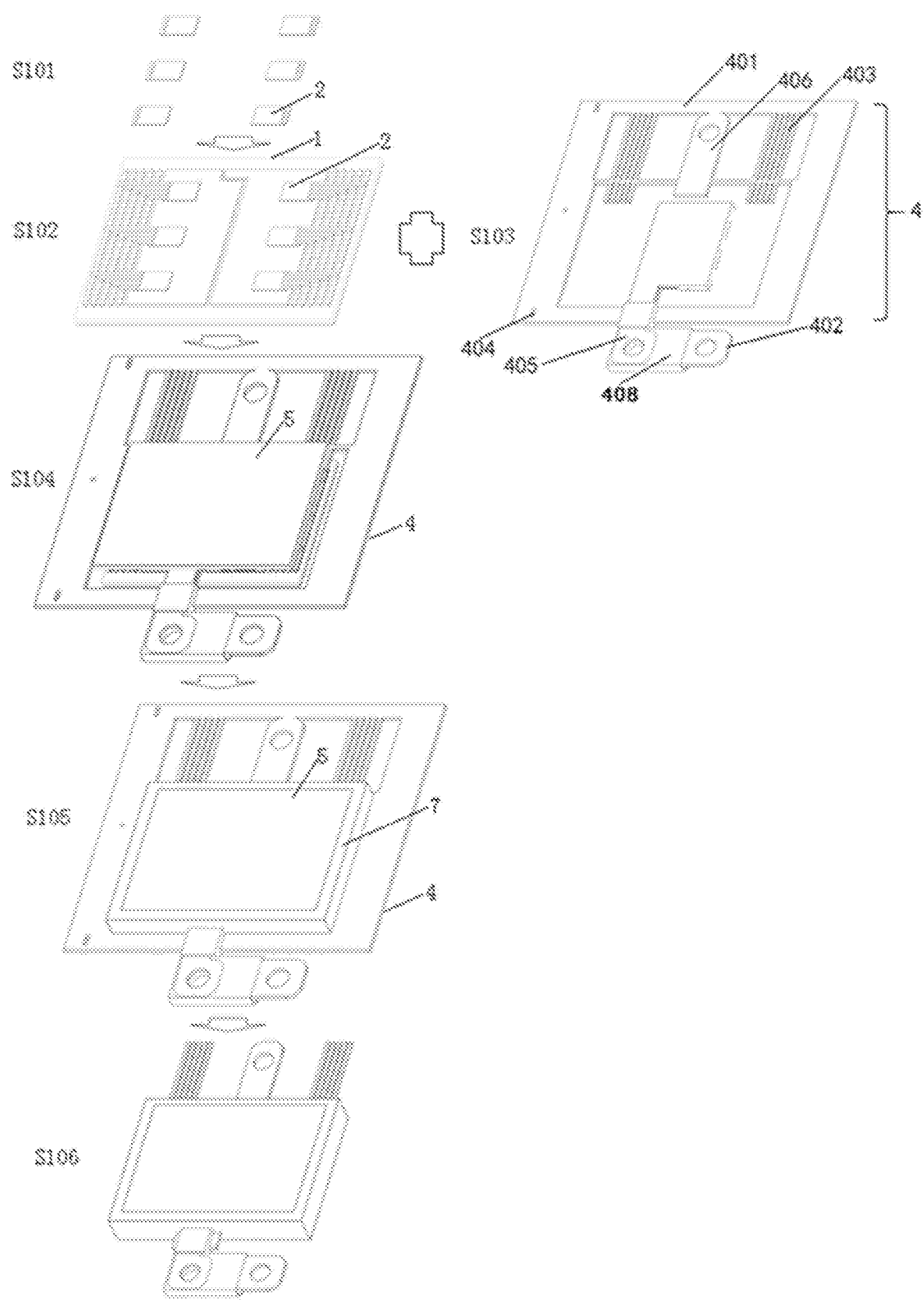
FIG. 8 is a flowchart of a manufacturing method of a power module according to an embodiment of the present disclosure.

FIG. 8 illustrates a flowchart of a manufacturing method of a power module according to an embodiment of the present disclosure. As shown in FIG. 8, the manufacturing method includes the following steps.

In S101, a group 2 of switch elements is provided, the group of switch elements including at least one pair of switch elements.

In S102, a base substrate 1 is provided, and the group 2 of switch elements is mounted on the base substrate 1.

In S103, a connector 4 is provided. The connector includes a signal terminal 403, a power terminal and a connecting portion 401. The power terminal includes a positive power terminal 405, a negative power terminal 402 and an output power terminal 406. The connecting portion 401 connects the signal terminal 403, the positive power terminal 405, the negative power terminal 402 and the output power terminal 406 together. The positive power terminal 405 and the negative power terminal 402 are a first metal layer and a second metal layer, respectively. The first metal layer and the second metal layer are at least partially stacked. An insulating layer 408 is disposed between the first metal layer and the second metal layer.

In S104, the connector 4 is electrically connected to the group 2 of switch elements. The signal terminal 403 is electrically connected to the signal end of the group 2 of switch elements, and the power terminal is electrically connected to the power end of the group 2 of switch elements. A top substrate 5 is provided. Providing the top substrate 5 is an optional step that can be skipped to directly perform the next step.

In S105, a molding part 7 is provided to mold the group 2 of switch elements, and the signal terminal 403 and the power terminal are fanned out from the molding part 7.

In S106, the connector 4 is trimmed, to finally obtain the power module as shown in FIG. 3.

It should be noted that, in step S102, according to a specific implementation, the group 2 of switch elements may be first connected to the base substrate 1 and then be performed with wire bonding. The connection may be in the form of soldering or silver sintering, or the like. The group 2 of switch elements includes at least one pair of switch elements. The switch element may be an IGBT, a MOSFET, a transistor or the like. The base substrate 1 may be a DBC substrate, a Cu substrate, an Al substrate, an Al—SiC substrate or the like. The wire bonding is to bond the signal terminal 403 of the chip to the base substrate 1 through a bonding wire. The bonding wire 3 may be an aluminum wire, a copper wire, a gold wire, a copper-aluminum composite wire or the like.

Figure 9:
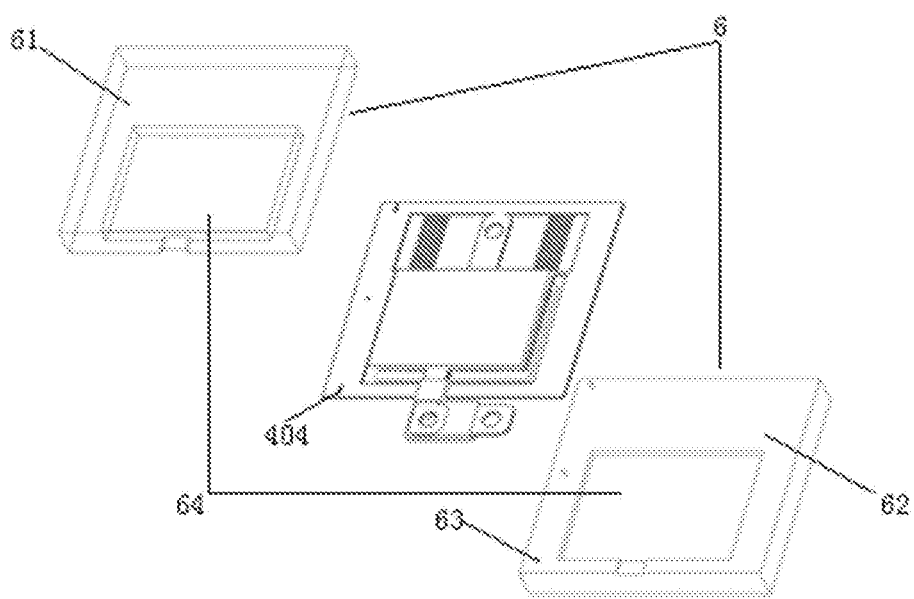
FIG. 9 is a schematic diagram of a molding process in a manufacturing method of a power module according to an embodiment of the present disclosure.

FIG. 9 is a schematic diagram of a molding process in a manufacturing method of a power module according to an embodiment of the present disclosure. As shown in FIGS. 8 and 9, a mold-die 6 for the molding process in step S105 is composed of two parts, i.e. an upper mold cavity 61 and a lower mold cavity 62. A positioning pin 63 on the lower mold cavity 62 is positioned and assembled with the molding positioning hole 404 on the connector 4. A hollowed portion 64 of the mold-die 6 is matched with the module to be molded. The upper mold cavity 61 and the lower mold cavity 62 are closed together and then molded. The molding part 7 is made of a conventional EMC (Epoxy Molding Compound), or additionally adding with a silicone component, and filler used for molding may be selected from alumina, silica, aluminum nitride or the like.

Figure 10:
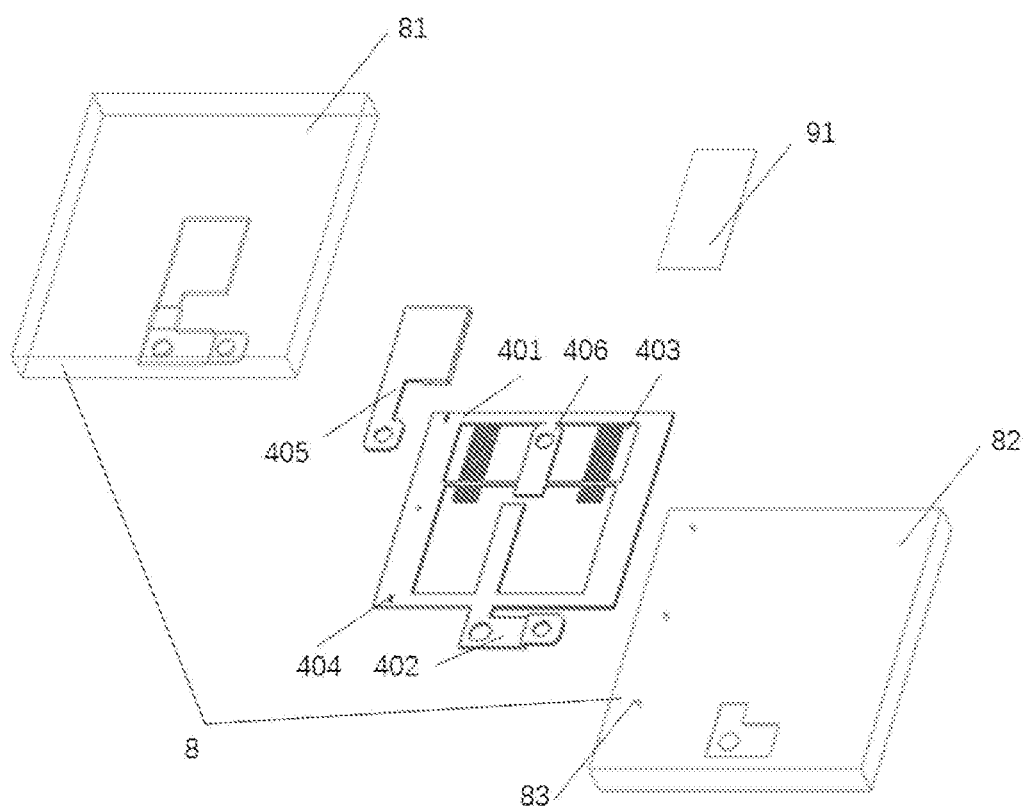
FIG. 10 is a schematic diagram of manufacturing a connector according to an embodiment of the present disclosure.

In step S103, the connector 4 may be manufactured in a different manner. FIG. 10 is a schematic diagram of manufacturing a connector according to an embodiment of the present disclosure. As shown in FIGS. 8 and 10, the manufacturing method of the connector 4 includes: forming a signal terminal 403, a negative power terminal 402, an output power terminal 406, and a connecting portion 401 from a single piece of metal; providing a positive power terminal 405; a pre-trim insulating material film or insulating fluid material 91 is disposed between the positive power terminal 405 and the negative power terminal 402, and forming the connector 4.

Specifically, each part of the connector 4 can be prepared by machining, stamping, etching or the like. After the preparation of the metal layer is completed, a pre-trim insulating material film or insulating fluid material 91 is placed between adjacent two layers of metal. Finally, the metal portion of the connector 4 and the insulating material are subjected to high-temperature hot pressing with a mold-die 8. The mold-die 8 includes an upper mold part 81 and a lower mold part 82. The lower mold part 82 includes a positioning pin 83 matching the molding positioning hole 404 on the connector 4, to finally complete production of the connector 4.

Figure 11:
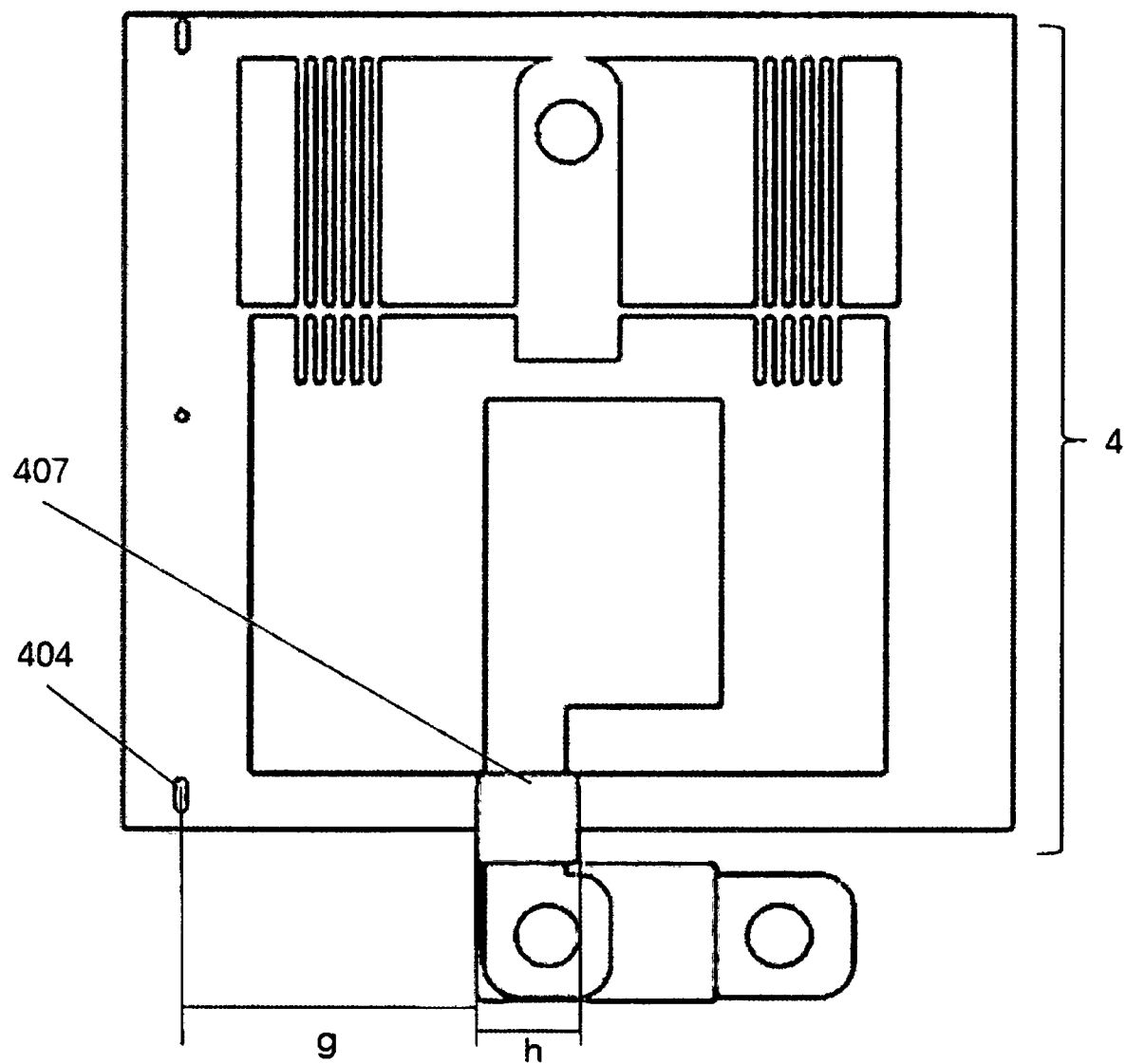
FIG. 11 is a schematic diagram showing the dimensions of a connector made according to FIG. 10.

FIG. 11 is a schematic diagram showing the dimensions of a connector made according to FIG. 10. As shown in FIG. 11, since the processing precision of the hot pressing mold-die 8 is generally +5 um, and the processing precision of the metal portion of the connector 4 is generally ±10 um, after the hot pressing, the tolerance g of a distance between the molding positioning hole 404 and the to-be-profiled portion 407 of the connector 4 can be controlled within ±30 um, and the tolerance h of the body size of the to-be-profiled portion 407 can be controlled within ±10 um.

Figure 12:
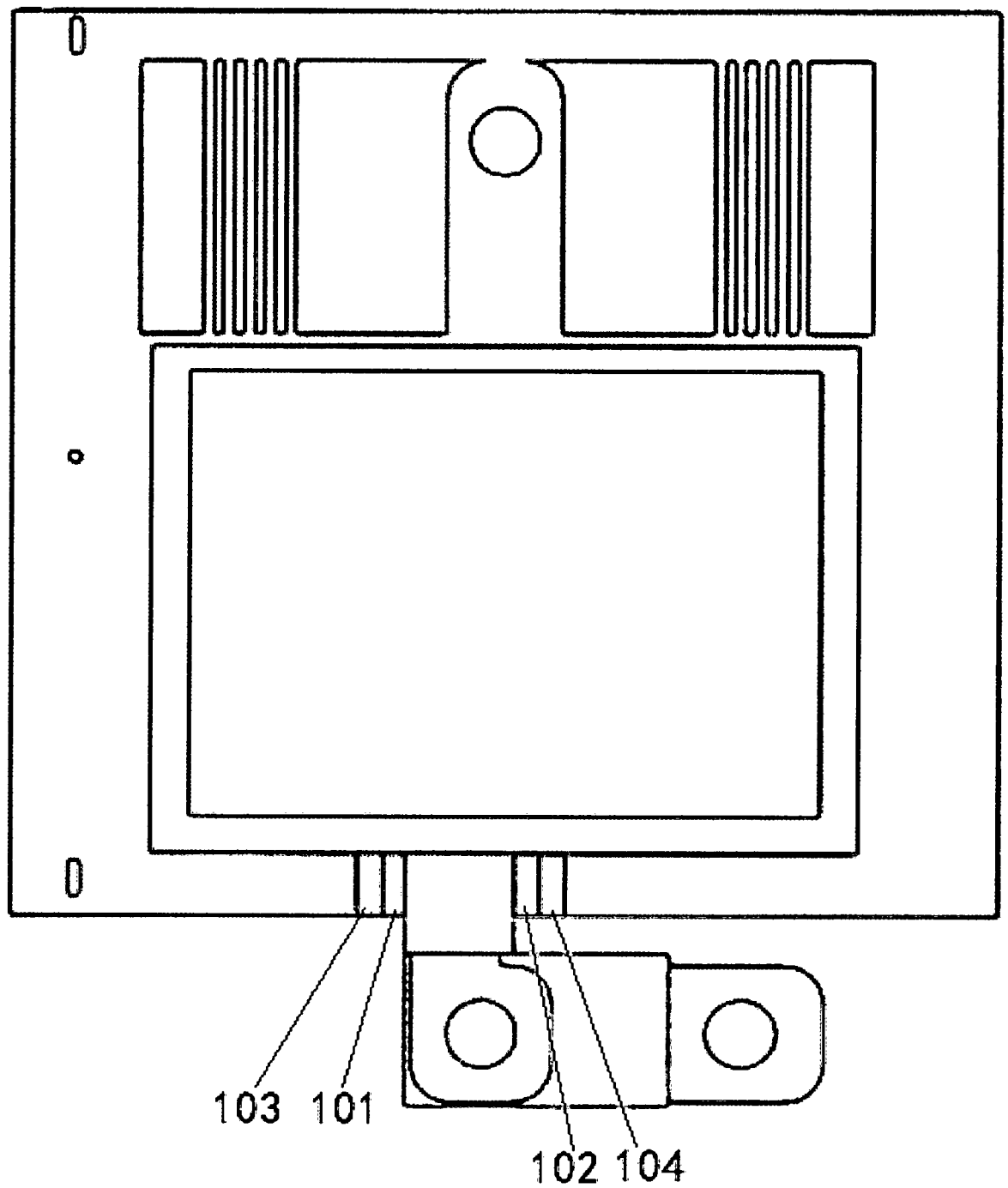
FIG. 12 is a schematic diagram of a position to be trimmed on the connector made according to FIG. 10.
Figure 13:
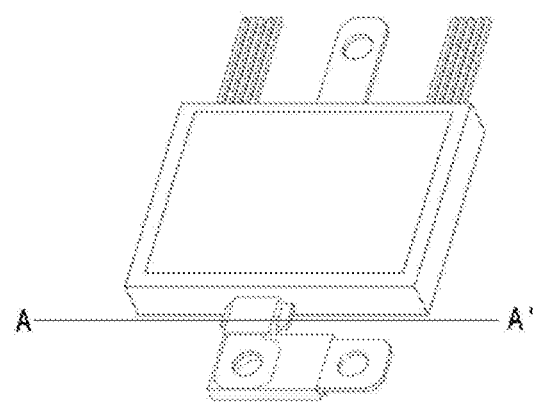
FIG. 13 is a schematic diagram showing the power module after the connector made according to FIG. 10 has been trimmed.
Figure 14:
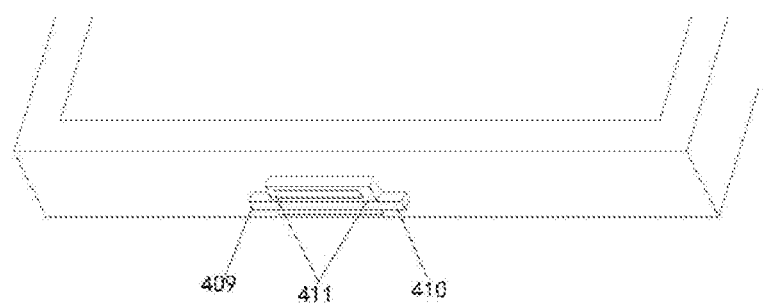
FIG. 14 is an enlarged cross-sectional view of the power module along the A-A' direction of FIG. 13.

In step S106, the molded power module is to be trimmed. FIG. 12 is a schematic diagram of a position to be trimmed on the connector made according to FIG. 10. FIG. 13 is a schematic diagram showing the power module after the connector made according to FIG. 10 has been trimmed. FIG. 14 is an enlarged cross-sectional view of the power module along the A-A' direction of FIG. 13. As shown in FIGS. 12-14, in the trimming process, firstly, the connector 4 is to be pressed by pressing blocks 101, 102 of the trimming mold; then the trim blade is used to trim along the positions 103, 104 beside the pressing blocks. After the trimming, the trimmed metal elements 409 and 410 protrude from the other metal layer and the insulating material 411 to form protrusions.

Figure 15:
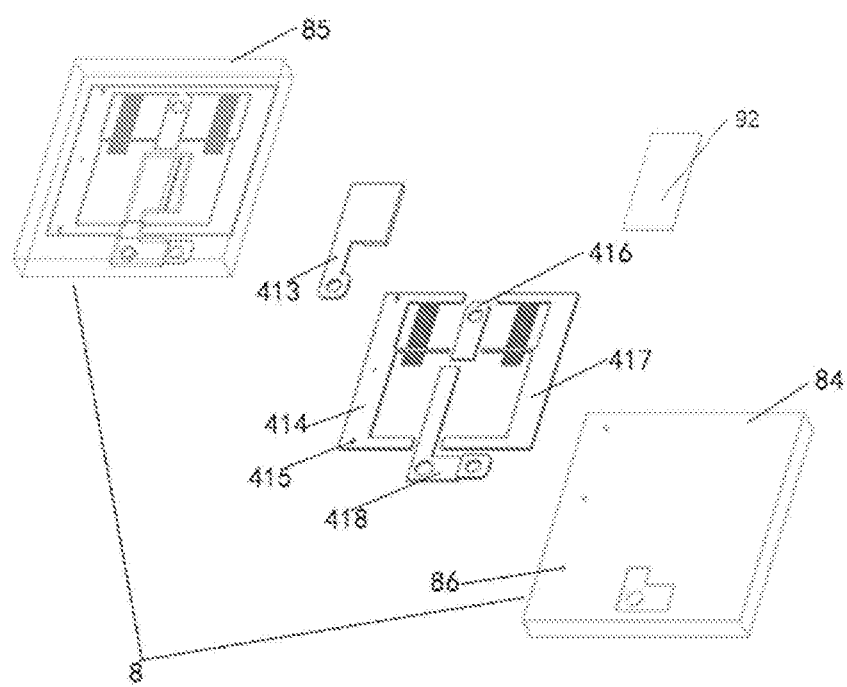
FIG. 15 is a schematic diagram of manufacturing a connector according to another embodiment of the present disclosure.

FIG. 15 is a schematic diagram of manufacturing a connector according to another embodiment of the present disclosure. As shown in FIG. 15, the manufacturing method of the connector 4 includes: separately preparing at least a part of a signal terminal, a negative power terminal 418, an output power terminal 416 and a connecting portion; providing a positive power terminal 413; and providing a pre-trim insulating material film or insulating fluid material 92 between the positive power terminal 413 and the negative power terminal 418, to form the connector 4.

Specifically, the connector 4 includes components 413, 414, 416, 417, 418, which may each be a pre-formed, separate component. At least one component, such as the component 414, is provided with a molding positioning hole 415. Each component may be prepared by machining, stamping, etching or the like. After the various components are prepared, a pre-trim insulating material film or insulating fluid material 92 is disposed between adjacent two layers of metal. Finally, the metal portion of the connector 4 and the insulating portion are subjected to high-temperature hot pressing with a mold-die 8. The mold-die 8 includes an upper mold part 85 and a lower mold part 84. The lower mold part 84 includes a positioning pin 86 matching with the molding positioning hole 404, to finally complete the production of the connector 4.

Figure 16:
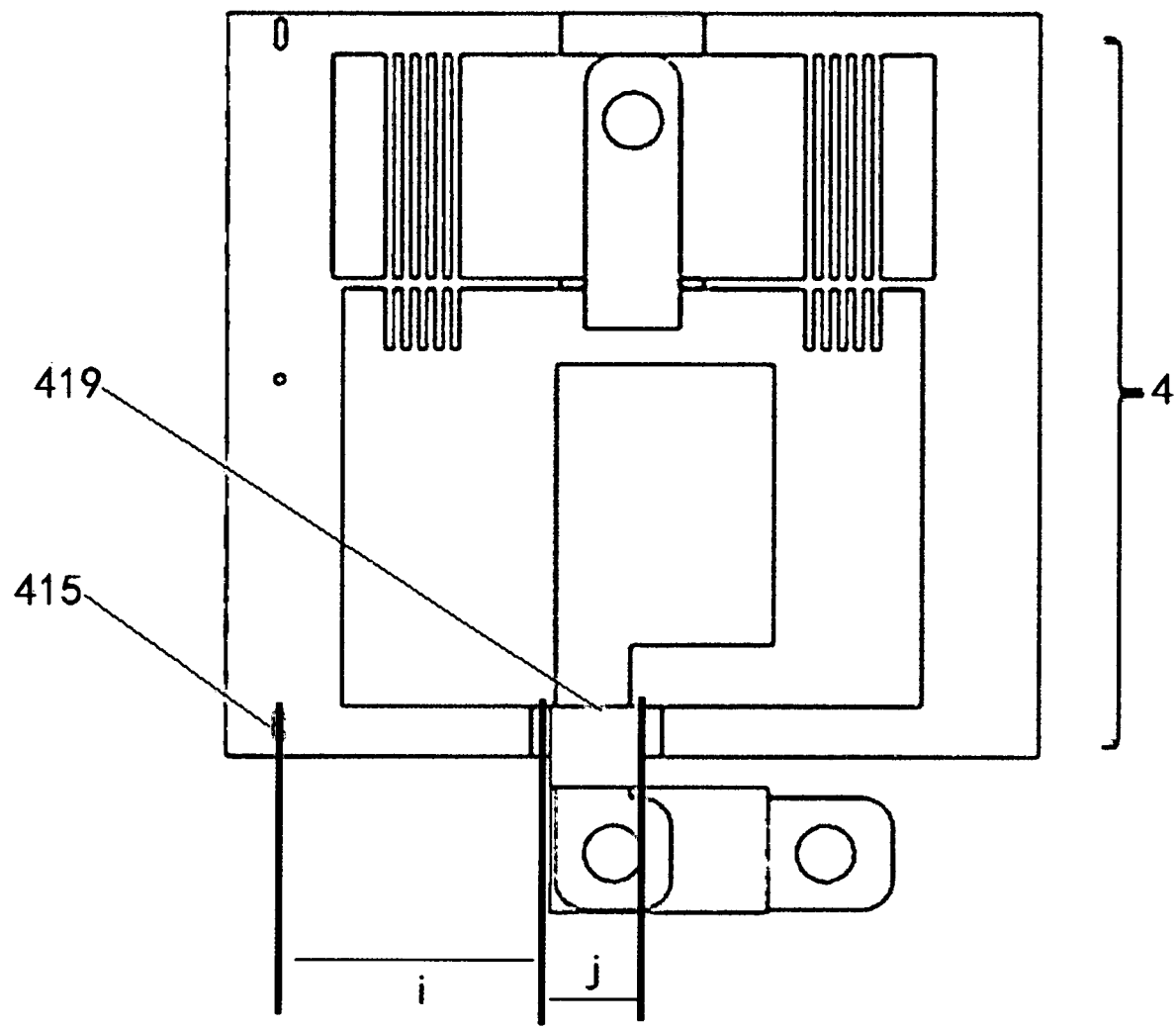
FIG. 16 is a schematic diagram showing e dimensions of the connector made according to FIG. 15.

FIG. 16 is a schematic diagram showing the dimensions of the connector made according to FIG. 15. As shown in FIG. 16, since the processing precision of the hot pressing mold-die 8 is generally ±5 um, and the processing precision of the metal portion of the connector 4 is generally ±10 um, after the hot pressing, the tolerance i of a distance between the molding positioning hole 415 and the to-be-profiled position 419 of the connector 4 can be controlled within ±30 um, and the tolerance j of the body size of the to-be-profiled position 419 can be controlled within ±10 um.

Figure 17:
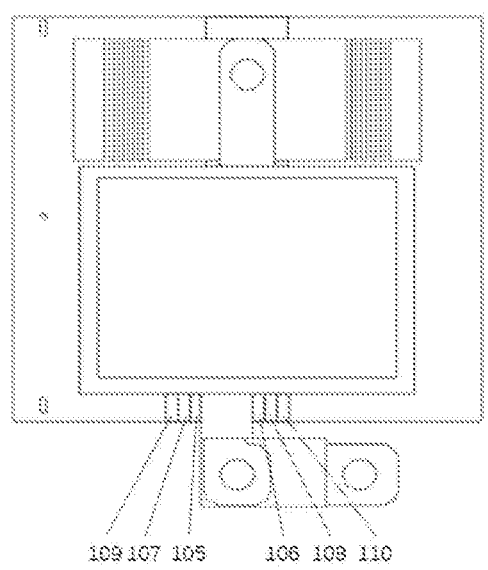
FIG. 17 is a schematic diagram of a position to be trimmed on the connector made according to FIG. 15.
Figure 18:
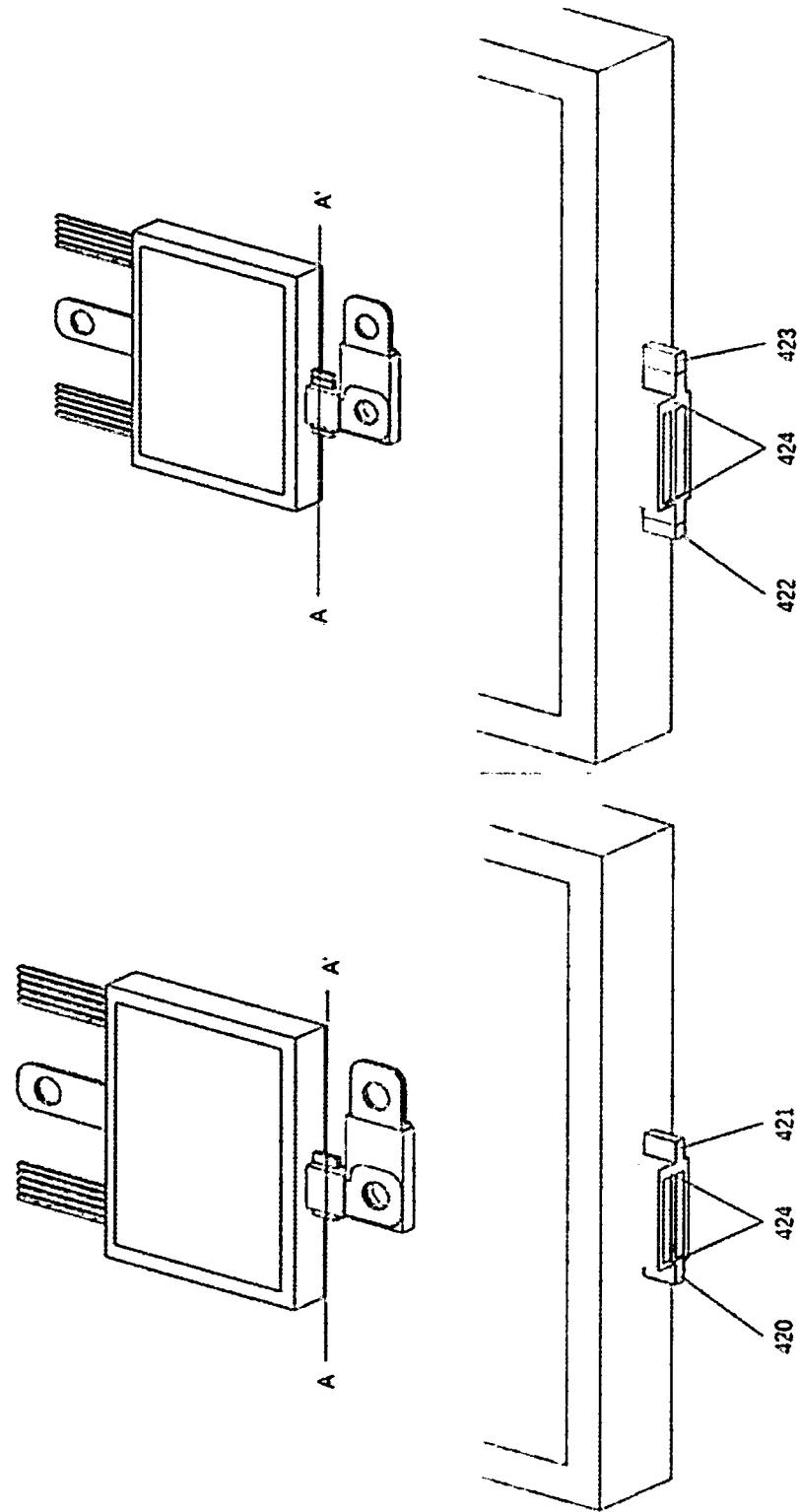
FIG. 18 is a schematic diagram of a power module and a projection of the connector made according to FIG. 15.

In step S106, the molded power module is to be trimmed. FIG. 17 is a schematic diagram of a position to be trimmed on the connector made according to FIG. 15. FIG. 18 is a schematic diagram of a power module and a projection of the connector made according to FIG. 15. As shown in FIGS. 17 and 18, in the trimming process, the connector 4 is to be pressed by the pressing blocks 105, 106 of the trimming mold. Then, the trim blade is used to trim along the positions 107, 108 or the positions 109, 110 beside the pressing blocks. If the trimming positions are the positions 107, 108 on the insulating material, the trimmed insulating materials 420 and 421 protrude from the other metal layer and the insulating material 424 to form protrusions. If the trimming positions are the positions 109, 110 on the metal material, the trimmed metal materials 422 and 423 protrude from the other metal layer and the insulating material 424 to form protrusions.

Figure 19:
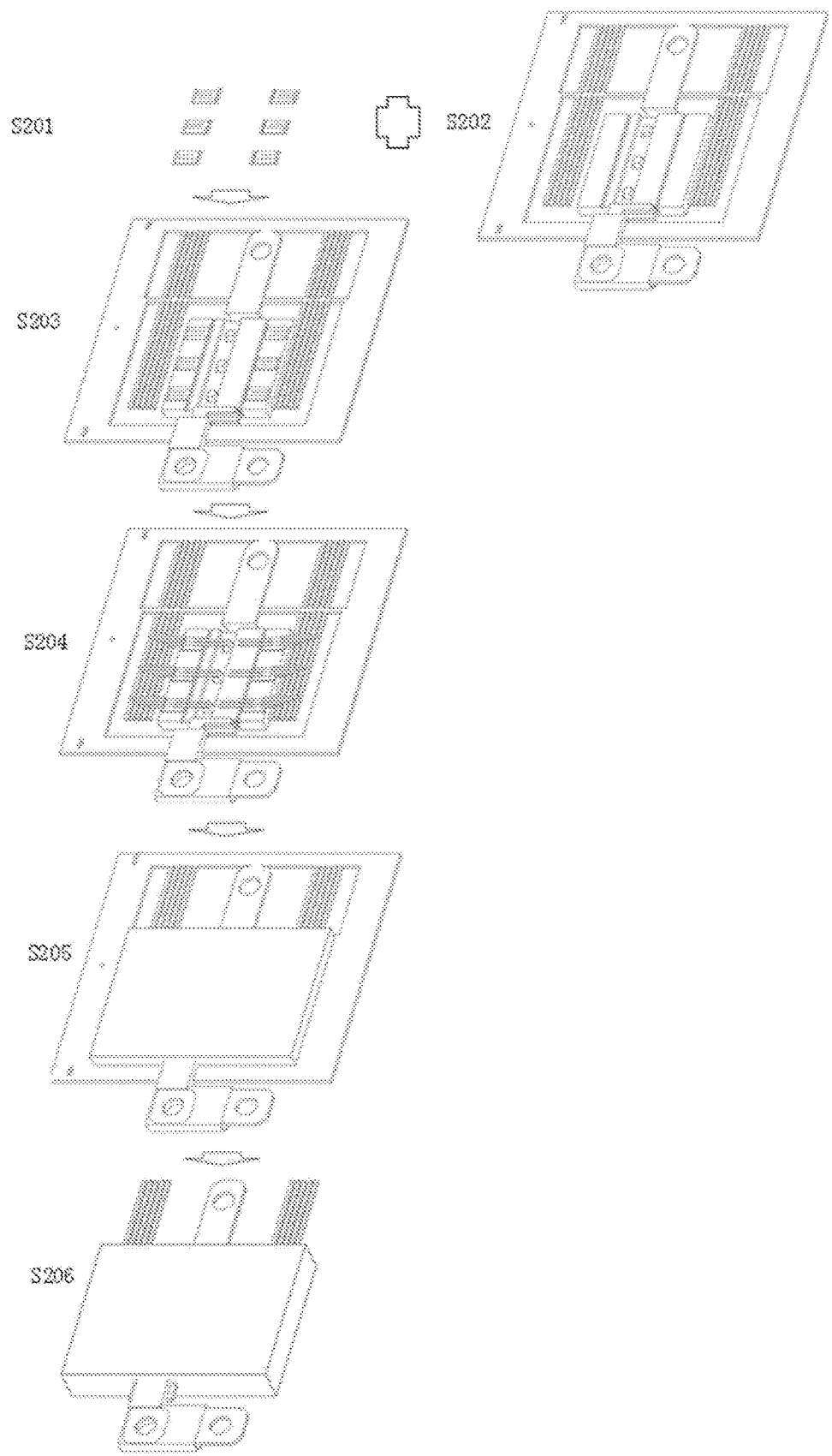
FIG. 19 is a flowchart of a manufacturing method of a power module according to another embodiment of the present disclosure.

In the above embodiments, the switch elements are all placed or mounted on the base substrate. In other embodiments, the power module may also be a structure without a base substrate, such as the group of switch elements being directly mounted on the connector. FIG. 19 is a flowchart of a manufacturing method of a power module according to another embodiment of the present disclosure. As shown in FIG. 19, the manufacturing method includes the following steps.

In S201, a group of switch elements is provided, the group of switch elements including at least one pair of switch elements.

In S202, a connector is provided, the connector including a signal terminal, a power terminal and a connection portion. The power terminal includes a positive power terminal, a negative power terminal and an output power terminal. The connection portion connects the signal terminal, the positive power terminal, the negative power terminal and the output power terminal together. The positive power terminal and the negative power terminal are respectively a first metal layer and a second metal layer which are at least partially stacked. An insulating layer is disposed between the first metal layer and the second metal layer.

In S203, the group of switch elements is mounted on the connector.

In S204, the connector is electrically connected to the group of switch elements. The signal terminal is electrically connected to the signal end of the group of switch elements, and the power terminal is electrically connected to the power end of the group of switch elements.

In S205, a molding part is provided, to package the group of switch elements, and the signal terminal and the power terminal are fanned out from the molding part.

In S206, the connector is trimmed, to finally obtain the power module as shown in FIG. 3.

It should be noted that, in step S203, the group of switch elements may be on the connector through soldering, silver sintering or the like. In step S204, the signal end and the power end of the group of switch elements are connected to the signal terminal and the power terminal of the connector. Wherein the signal terminal can be connected through a bonding wire, and the power terminal can be connected through the bonding wire 3, or may be bridged by a metal material. The connection with the metal material may be welding, silver sintering or the like. The bonding wire may be an aluminum wire, a copper wire, a gold wire, a copper-aluminum composite wire or the like.

Compared with the embodiment shown in FIG. 8, this embodiment is different in that the group of switch elements is directly mounted on the connector instead of being mounted on the base substrate. Other related features regarding the group of switch elements, the connector, the molding, the trimming and the like may be the same as or similar to the embodiment shown in FIG. 8, and will not be repeated herein. In this way, the cost of the base substrate can be eliminated and the cost for the power module can be reduced.

According to an embodiment of the present disclosure, the group of switch elements may be mounted to the positive power terminal or the negative power terminal of the connector according to specific demands.

From the above detailed description, those skilled in the art will readily appreciate that a power module and a manufacturing method thereof according to embodiments of the present disclosure have one or more of the following advantages.

The power module according to some embodiments of the present disclosure can greatly reduce the parasitic inductance of the power module by stacking the positive power terminal and the negative power terminal.

According to the manufacturing method of the power module according to some embodiments of the present disclosure, by integrating the signal terminal, the power terminal and the connecting portion into an integral connector, the tolerance of the distance between the molding positioning hole and the power terminal can be controlled within ±30 um, and the tolerance of the body size of the terminal can be controlled within ±10 um, which can meet the package requirements and facilitate production.

Other embodiments of the disclosure will be apparent to those skilled in the art from consideration of the specification and practice of the disclosure disclosed here. This application is intended to cover any variations, uses, or adaptations of the disclosure following the general principles thereof and including such departures from the present disclosure as come within known or customary practice in the art. It is intended that the specification and examples be considered as exemplary only, with a true scope and spirit of the disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the disclosure only be limited by the appended claims.

What is claimed is:

1. A manufacturing method of a power module, comprising:

providing a group of switch elements, the group of switch elements comprising at least one pair of switch elements;

providing a connector, the connector comprising at least two signal terminals, a power terminal and a connecting portion, wherein the power terminal comprises a positive power terminal, a negative power terminal and an output power terminal, the connecting portion connects the at least two signal terminals, the positive power terminal, the negative power terminal and the output power terminal together, and wherein the positive power terminal and the negative power terminal are respectively a first metal layer and a second metal layer, the first metal layer and the second metal layer being at least partially stacked, with an insulating layer disposed between the first metal layer and the second metal layer;

electrically connecting the connector to the group of switch elements, wherein the at least two signal terminals are electrically connected to signal ends of the group of switch elements, and the power terminal is electrically connected to a power end of the group of switch elements;

providing a molding part, packaging the group of switch elements and fanning out the at least two signal terminals and the power terminal from the molding part; and trimming the connector, wherein the pair of switch elements comprises a first switch element and a second switch element, the first switch element comprising a first end, a second end, and a third end, the second switch element comprising a fourth end, a fifth end, and a sixth end, wherein the second end and the fourth end are electrically connected together as a power end electrically connected to the output power terminal, and wherein the first end, as a power end, is electrically connected to the positive power terminal, and wherein the fifth end, as a power end, is electrically connected to the negative power terminal, and wherein the third end and the sixth end, as the signal ends, are electrically connected to one of the at least two signal terminals.

2. The manufacturing method according to claim 1, wherein the trimming the connector comprises: pressing the connecting portion with pressing blocks, and then trimming at a position beside the pressing blocks.

3. The manufacturing method according to claim 1, further comprising:
providing a base substrate, before the connector is electrically connected to the group of switch elements, mounting the group of switch elements on the base substrate, and disposing the base substrate within the molding part.

4. The manufacturing method according to claim 3, further comprising:
providing a top substrate, after the connector is electrically connected to the group of switch elements, disposing the group of switch elements between the top substrate and the base substrate, and disposing the top substrate within the molding part.

5. The manufacturing method according to claim 1, further comprising:
before the connector is electrically connected to the group of switch elements, mounting the group of switch elements to the connector.

6. The manufacturing method according to claim 5, wherein the group of switch elements is mounted to the positive power terminal or the negative power terminal of the connector.

7. The manufacturing method according to claim 1, further comprising:
providing a molding positioning hole on the connector, and fitting the molding positioning hole with the positioning pin of a mold to perform molding.

8. The manufacturing method according to claim 1, wherein the providing a connector comprises:
forming the at least two signal terminals, the negative power terminal, the output power terminal and the connecting portion from a single piece of metal;
providing the positive power terminal; and
disposing the insulating layer between the positive power terminal and the negative power terminal.

9. The manufacturing method according to claim 1, wherein the providing a connector comprises:
forming at least a part of the at least two signal terminals, the negative power terminal, the output power terminal and the connecting portion separately;
providing the positive power terminal; and
disposing the insulating layer between the positive power terminal and the negative power terminal.

10. The manufacturing method according to claim 8, wherein the providing a connector further comprises: subjecting the portions of the connector to hot pressing at a high temperature with a mold-die.

11. The manufacturing method according to claim 9, wherein the providing a connector further comprises: subjecting the portions of the connector to hot pressing at a high temperature with a mold-die.

12. A power module, comprising:
a group of switch elements, comprising at least one pair of switch elements;
a molding part, packaging the group of switch elements; and
a connector, comprising:
at least two signal terminals electrically connected to signal ends of the group of switch elements and fanned out from the molding part; and
a power terminal electrically connected to a power end of the group of switch elements and fanned out from the molding part, wherein the power terminal comprises a positive power terminal, a negative power terminal and an output power terminal, the positive power terminal and the negative power terminal are respectively a first metal layer and a second metal layer, the first metal layer and the second metal layer are at least partially stacked, and an insulating layer is disposed between the first metal layer and the second metal layer,
wherein the pair of switch elements comprises a first switch element and a second switch element, the first switch element comprising a first end, a second end, and a third end, the second switch element comprising a fourth end, a fifth end, and a sixth end, wherein the second end and the fourth end are electrically connected together as a power end electrically connected to the output power terminal, and wherein the first end, as a power end, is electrically connected to the positive power terminal, and wherein the fifth end, as a power end, is electrically connected to the negative power terminal, and wherein the third end and the sixth end, as the signal ends, are electrically connected to one of the at least two signal terminals.

13. The power module according to claim 12, wherein the positive power terminal and the negative power terminal have protrusions on the sides thereof.

14. The power module according to claim 12, further comprising a base substrate disposed in the molding part, wherein the group of switch elements is mounted on the base substrate.

15. The power module according to claim 14, further comprising a top substrate disposed in the molding part, wherein the group of switch elements is disposed between the top substrate and the base substrate.

16. The power module according to claim 12, wherein the group of switch elements is mounted on the connector.

17. The power module according to claim 16, wherein the group of switch elements is mounted on the positive power terminal or the negative power terminal of the connector.

18. The power module according to claim 12, wherein the positive power terminal and the negative power terminal are fanned out from a first side of the molding part, and the at least two signal terminals and the output power terminal are fanned out from a second side opposite to the first side of the molding part.

19. The power module according to claim 12, wherein a distance between the first metal layer and the second metal layer is not more than 0.5 mm.

* * * * *